United States Patent
Brill et al.

(10) Patent No.: US 6,704,920 B2
(45) Date of Patent: Mar. 9, 2004

(54) PROCESS CONTROL FOR MICRO-LITHOGRAPHY

(75) Inventors: Boaz Brill, Lezion (IL); Yoel Cohen, Ness Ziona (IL)

(73) Assignee: Nova Measuring Instruments Ltd., Rehovot (IL)

( * ) Notice: Subject to any disclaimer, the term of this patent is extended or adjusted under 35 U.S.C. 154(b) by 198 days.

(21) Appl. No.: 09/984,640

(22) Filed: Oct. 30, 2001

(65) Prior Publication Data

US 2002/0072003 A1 Jun. 13, 2002

(30) Foreign Application Priority Data

Oct. 30, 2000 (IL) ................................................ 139368

(51) Int. Cl.⁷ .............................................. G06F 17/50
(52) U.S. Cl. ............................ 716/19; 716/5; 430/30; 430/311; 438/16; 700/121
(58) Field of Search .............................. 716/19, 21, 5; 430/30, 311; 438/16; 700/121

(56) References Cited

U.S. PATENT DOCUMENTS

| | | | |
|---|---|---|---|
| 4,191,462 A | * 3/1980 | Johnson | 396/105 |
| 5,170,293 A | * 12/1992 | Tanimoto | 359/894 |
| 5,840,448 A | * 11/1998 | Borodovsky et al. | 430/5 |
| 5,867,276 A | 2/1999 | McNeil et al. | |
| 5,963,329 A | 10/1999 | Conrad et al. | |
| 6,115,108 A | 9/2000 | Capodieci | |

FOREIGN PATENT DOCUMENTS

| | | |
|---|---|---|
| DE | 19922614 | 6/2000 |
| WO | WO 00/35002 | 6/2000 |

OTHER PUBLICATIONS

I. Kallioniemi et al., "Optical Scatterometry of Subwavelength Diffraction Gratings: Neural–Network Approach", *Applied Optics*, Sep. 1, 1998, pp. 5830–5835, vol. 37, No. 25.

J. Bischoff et al., "Optical Scatterometry of Quarter Micron Patterns Using Neural Regression", Proceedings of the Spie, *SPIE*, 1998, pp. 526–537, vol. 3332.

Niu, Xinhui. "Specular Spectroscopic Scatterometry in DUV Lithography," *Part of the SPIE Conference on Metrology, Inspection, and Process Control for Microlithography* XIII, Santa Clara, California, Mar., 1999, SPIE vol. 3677–0277 786X/00.

Benesch, N. "Phi–Scatterometry for ON–line Process Control," AEC/APC Symposium XII, Lake Tahoe, Nevada, Sep. 23–28, 2000.

* cited by examiner

*Primary Examiner*—Matthew Smith
*Assistant Examiner*—Sun James Lin
(74) *Attorney, Agent, or Firm*—Browdy and Neimark, P.L.L.C (57) ABSTRACT

A method is presented for controlling a process to be applied to a patterned structure in a production run. Reference data is provided being representative of diffraction signatures corresponding to a group of different fields in a structure similar to the patterned structure in the production line, and of a control window for the process parameters corresponding to a signature representative of desired process results. The group of different fields is characterized by different process parameters used in the manufacture of these fields. The method utilizes an expert system trained to be responsive to input data representative of a diffraction signature to provide output data representative of corresponding effective parameters of the process. Optical measurements are applied to different sites on the patterned structure in the production line to obtain diffraction signatures of thereof and generate corresponding measured data. The expert system analyses the measured data to determine effective parameters of the process applied to the patterned structure in the production line. The effective process parameters can then be analyzed to determine deviation thereof from corresponding nominal values, to thereby enable the process control.

17 Claims, 4 Drawing Sheets

PROCESS CONTROL FOR MICRO-LITHOGRAPHY

FIELD OF THE INVENTION

This invention is generally in the field of process control techniques, and relates to a method and system for controlling a process of manufacturing patterned structures, such as photolithography and etching processes.

BACKGROUND OF THE INVENTION

The currently common methods for process control in photolithography, particularly micro-lithography, are based on the use of CD-SEM. The latter is a stand-alone tool, which performs measurements of critical dimensions (minimal lateral dimensions of a pattern) for creating Statistical Process Control (SPC) trend charts for further monitoring thereof. One of these methods involves creating a so-called "Focus-Exposure Matrix" (FEM), produced by varying the focus and exposure (energy) parameters of the lithography from field to field within the wafer, thereby producing a two-dimensional array of fields spanning a range of these parameters. By determining CD in each of the FEM fields, optimal values of the focus and exposure, as well as their allowed tolerance (process window), are determined for each specific process.

Recently, tools based on scatterometry have been developed, which provide for higher accuracy and repeatability, faster measurement, smaller volume and lower cost, as compared to CD-SEM tools. Such scatterometry-based tools are disclosed, for example, in U.S. Pat. Nos. 5,867,276 and 5,963,329; and in the following publication: "*Specular Spectroscopic Scatterometry in DUV Lithography*", Xinhui Niu et al, SPIE Vol. 3677, SPE Conference on Metrology, Inspection and Process Control for Microlithography XIII, pp. 159–168.

Scatterometry is a method by which the optical signature (spectral response) of a periodic structure is measured. The signature can be obtained by measuring the optical properties of a structure (reflectance or ellipsometric parameters) as a function of one or more light parameters, e.g., the angle of incidence, polarization or wavelength. Due to the periodicity of the structure, it is possible to theoretically calculate the signature of a given sample using exact models thereof (e.g., utilizing a Rigorous Couple Wave Theory (RCWT)). Processing is thus performed by correlating the measured signature to theoretically calculated signatures, while fitting the structure's parameters. This fitting method suffers from such drawbacks as long calculation time, in-adequacy to real-time calculations, and the need for detailed knowledge about the structure (e.g., optical constants) that is required as input to the model. The problem of long calculation time is usually overcome by preparing a library of pre-calculated signatures. This procedure, however, requires a long setup time. The detailed knowledge about the structure, in many cases, also requires preliminary setup processes, such as material characterization. Additionally, the measurement is limited to periodic structures that do not usually exist within the die, thus requiring fabricating special test structures and correlating the measurements on these test structures to measurements taken within the die. Yet another problem is the complicated, sometimes indirect relation between the process parameters (e.g., focus and exposure) and the profile parameters, rendering the attempt to control the process by modifying process parameters based on profile information, which is difficult to implement. These problems impede the application of scatterometry-based systems as a production tool, specifically for integrated monitoring that require a fast feedback for process control.

According to another technique, disclosed in the article "*Phi-Scatterometry for On-line Process Control*", N. Benesch et al, AEC/APC Symposium XII, Lake Tahoe, Nev., USA, Sep. 23–28, 2000, the signatures measured in different fields of a Focus-Exposure Matrix are classified using a neural network (NN) under those found within the control limits and those found outside of them. In other words, this technique provides only "pass"/"fail" information which allows a Process Alarm to be operated. However, no quantitative information is provided, therefore feedback to the process (adjusting the working parameters of the processing tool in a closed loop control) is impossible.

SUMMARY OF THE INVENTION

There is accordingly a need in the art to facilitate the control of a process of manufacturing patterned structures, particularly micro-lithography, by providing a novel control method and system. The present invention introduces a methodology that starts with identifying those major process parameters whose variation affects the process results. This new methodology also directly exploits the dependence of the measured signature on the process parameters, without requiring any model having predictive capabilities with regard to the way this dependence is manifested.

The invention is particularly useful for controlling a lithography process, wherein focus and exposure are among the dominant factors affecting the lithographical profile (critical dimensions, wall angle, etc.). These parameters are usually considered in order to control the lithography process and keep the resulting profile within the required control limits. The new methodology bypasses the main limitations inherent in conventional scatterometry as presented above.

In the description below, the following terms as used:

The term "parametric matrix" or in short "matrix" used herein signifies a set of patterned structures (wafers) and/or fields created within the structure(s), that were fabricated using different values of one or more working parameters of the process to be controlled. Consequently, the term "matrix field" or in short "field" signifies one specific part of a parametric matrix, being a wafer or part of a wafer, having a specific value or set of values of the working parameters. All fields are supposed to include equivalent measurement sites, not necessarily in the same locations.

The term "measurement site" or in short "site" refers to a specific location found within each matrix field where the signature measurement is actually being taken.

The term "signature" signifies an optical response of the structure to predetermined incident light. Such a signature may be measured as a diffraction of light interacting with the structure as a function of a light parameter such as wavelength (spectrum), angle of incidence, ellipsometry, etc. The term "signature" refers to the total optical information that can be attained from a certain field, including several measurements taken at different measurement conditions, different measurement tools and/or at different measurement sites within the same field.

The term "reference tool results" signifies the results of one or more measurements applied to the parametric matrix or a part thereof by reference tools other than the measurement apparatus of the present invention.

The term "reference data" refers to all data available in order to perform the setup process (training of the NN), including mainly but not only signatures measured on a group of matrix fields and reference tool results from corresponding fields, as well as the processing conditions of the same field and any other sort of information available on these fields.

The term "control window" or "process window" signifies a range or ranges of one or more working (process) parameters providing desired process results.

The term "merit function" refers to a function that gets two signatures as input and results with a single number that is some measure of the "distance" between the two input signatures.

There is thus provided according to one aspect of the present invention, a method of controlling a process to be applied to a patterned structure in a production run, the method comprising the steps of:

(i) providing reference data including data representative of diffraction signatures corresponding to a group of different fields in a structure similar to said patterned structure in the production line, and data representative of a control window for the process parameters corresponding to a signature representative of desired process results, said group of different fields being characterized by different process parameters used in the manufacture of these fields;

(ii) providing an expert system trained to be responsive to input data representative of a diffraction signature to provide output data representative of corresponding effective parameters of the process;

(iii) applying optical measurements to at least one site on said patterned structure in the production line to obtain at least one diffraction signature of said patterned structure in the production line and generate data representative thereof;

(iv) supplying the generated data to said expert system, which analyses the data to thereby determine effective parameters of the process applied to said patterned structure in the production line; and (v) analyzing said effective process parameters to determine deviation thereof from corresponding nominal values to thereby enable the process control.

The reference data is created during an off-line operational mode (calibration procedure) consisting of the following. The process to be controlled is applied to different fields on a test structure (wafer) or to different test structures, utilizing different values of one or more working parameters of the process, thereby preparing a parametric matrix including variations of at least one working parameter. When dealing with a lithography process, such a parametric matrix is typically an F-E matrix (FEM). The FEM is printed by using the same or similar mask as that used in the production run, varying the exposure along one axis and the focus along the other axis of a two-dimensional field array. Then, measurements are applied to the test wafer(s) in order to determine the signatures corresponding to a group of different fields.

Optionally, additional measurements are applied to the same field using reference tools (e.g. CD-SEM, Cross Sectional SEM, AFM) and their results are added to the reference data. For example, when dealing with a lithography process, CD-SEM values measured on the same F-E matrix fields may be used as reference tool results. The setup process is finalized by using the entire reference data as a training set for training an expert system, e.g., an artificial neural network (NN). In this stage, the NN is trained to return the process parameters and any available reference tool results upon receiving signatures as input. Once the NN is properly trained to do this with the training set data, i.e., with the reference data, it will usually also be able to find the correct process parameters when inputting a new signature.

During an on-line operational mode (real-time measurements during a production run), optical signatures are measured at different sites on the real structure, and supplied as input to the NN. The NN then outputs the effective process parameters corresponding to each signature. Closed loop process control can than be performed using the deviations of the effective process parameters from their corresponding nominal values. For example, in the lithography case, if measured signatures consistently show that the effective exposure is lower than the nominal one, correction may be applied to the process by means of increasing the exposure value. This process control method thus overcomes one of the problems of conventional scatterometry: eliminates the need to explicitly translate a change in profile parameters into a required change in process parameters, since the required change in process parameter is a direct output of the method of the present invention. In fact, with respect to the present example of the lithography process, even if the source of the profile change is other than the exposure, the profile may still be accurately corrected by changing the exposure. The nature of the closed-loop-control may include different methods such as feedback, feed-forward, etc.

Preferably, the method of the present invention also includes re-training of the NN. As described above, a set of fields is used in order to prepare the reference data by spanning the process window in several selected process parameters. In the lithography example, the use of a single wafer allows spanning the process window both in exposure and focus. However, there are many other process parameters that are assumed to be constant and are not actively varied throughout the selected set of fields, so-called "hidden parameters". In the lithography example, when using a single FEM wafer, film thickness for all the stack films are hidden parameters.

The values of hidden parameters may later on be changed, thereby affecting the diffraction signature in a manner that was not taken into consideration when training the NN. This introduces errors into the NN results. One way to eliminate the effect of hidden parameters is to "unhide" them, i.e., to expand the matrix so as to include the hidden parameters as active parameters of the matrix. For example, photoresist film thickness may become a matrix parameter by producing several FEM wafers having deliberately different film thicknesses. By applying measurements to all wafers and including all the measurement results into the reference data used to train the NN, the effect of the variable film thickness may be taken into account in the same way as focus and exposure parameters.

There are two different ways to treat the expanded matrix. According to one embodiment of the method, a new parameter (photoresist film thickness in the above example) should be a control parameter to be treated on equal footing as the other parameters. To this end, the value of the new parameter must be known at each field and added to the reference data. In the lithography example, each wafer has to be measured for its film thickness and the NN has to be trained to output F, E and film thickness values. However, it is also possible to train the NN with all the field signatures, regardless of which wafer they come from, without requiring the NN to output the new matrix parameter(s) (film thickness). In this case, the NN will learn how to provide the correct values for the existing matrix parameters (F and E) regardless of the values of the new matrix parameter(s) (film thickness). Since their exact values are not required, the values for the new parameters (film thickness) do not need to be measured in this case. Therefore, in this case, the effect of the expanded matrix consists of "immunizing" the NN from possible errors coming from variations in the new parameter(s) (film thickness). Such additional parameters that are sampled but not controlled will be referred to as "sampled parameter", in contrast to the "control parameters".

It should be noted that expanding the matrix means preparing and measuring additional wafers, resulting in an increase in setup time and effort. If, for example, there are n sampled parameters and each of them needs be sampled m times across their corresponding allowed ranges, then the expanded matrix size will be $m^n$ times the size of original matrix, including only the control parameters, making the expanded matrix impractical in many cases. To partly overcome this problem, a "sparsely expanded matrix" can be used in which the sampled parameters are not fully sampled for all possible cases, but rather sampled sparsely. If, for example, there are two sampled parameters, and each needs in principle to be sampled 5 times, then instead of multiplying the matrix size by $5^2=15$, a sparse sampling of as few as 5–9 cases may supply most of the required information in order to immune the system from variations in these two parameters.

An effective way to immune the system to possible errors is to use the naturally occurring distribution of the hidden parameters. By randomly choosing a group of fields with varied production conditions (e.g., coming from different wafers, different lots, different tools or different time), the reference set may naturally be populated with fields having the correct distribution in all hidden parameters. Such a training set may allows the NN immunization to take place without actively sampling a large number of hidden parameters (which may even be unknown) and without the need to produce and measure a large number of fields.

One specifically attractive way to sample the naturally occurring distribution is to utilize wafers that are anyhow produced for regular periodical tests. For example, FEM wafers are routinely produced (in many cases, daily) in order to verify the stability of the production process and follow variations. Thus, by adding each time (day) additional information about new wafers, it is possible to improve the immunity of the system with time.

Additionally, the method of the present invention may include immunizing the NN to possible machine errors that are common in different measurement tools. If, for example, the measurement tool may have gain and offset errors, it is possible to immune the system to such errors by simulating them. In this case, after measuring a set of signatures for a set of fields, machine errors are simulated by artificially adding bias and gain factors to the signatures. Each signature may be thus duplicated several times, applying to different duplicates different amounts of gain and offset, thus producing additional sampled parameters to the matrix.

A set of signatures measured on the parametric matrix can be used as a signature library (look-up-table), which may be part of the reference data. According to this embodiment, during production run, every measured signature is compared to the signatures stored in the signature library, while searching for the signature that is the closest to the measured one. The search is carried out using a "merit function" that measures the level of fitting between any two signatures.

The signature library can also be used for verification when using an NN for the fitting process. Verification is needed, since the NN-based method, as described above, has no internal way of measuring how successful the interpretation is, i.e., what reliability the user should attribute to the results. Verification may be done in one of the following ways:

1. Searching the signature library and comparing the NN results to the search results: if the results are sufficiently close in the control parameters space, then the NN result is assigned a high reliability score;

2. Looking in the signature library for the signature whose "coordinates" in the control parameters' space are the closest ones to the NN result and comparing this library signature with the newly measured signature: if the merit function between the library signature and the new signature is sufficiently low, the NN result gets a high reliability score.

The data collection and analysis technique of the present invention enables to overcome most of the inherent disadvantages of conventional scatterometry, namely:

The setup of the present invention is simpler and requires neither deep understanding of the application nor long calculations. The setup may therefore be used for any structure, regardless of the complexity of underlying layers or the structure of the profiles, without the need to find the optical characteristics of the material involved. It may also be easily used by operators having minimal training.

The technique of the present invention can be applied to any measurement site, and not only to line gratings. Among the possible sites may be, for example, hole arrays, memory cells or any other diffracting structure. The only desired conditions are as follows: (1) the measured signal should not strongly depend on the exact measurement location, within the positioning accuracy of the system, and (2) light diffraction should be sufficiently strong to make the optical signal sensitive to the process parameters.

Real time measurement is very fast, regardless of the application complexity

Close loop control is directly available, as the output is already given in terms of the control parameters.

It should also be noted that, in distinction to the prior art classification method utilizing a learning system, the method of the present invention allows quantitative process control, while the classification technique allows solely process alarm. This is due to the fact that the output obtained with the invented method is continuous, while the only output obtainable with the prior art-technique is indicative of whether the profile is within the process window or not. Additionally, the method of the present invention has several mechanisms allowing it to be immune to different naturally-occurring variations that may affect the interpretation, making it more robust.

According to another aspect of the present invention, there is provided a production line for manufacturing patterned structures in a production run comprising:

(a) a processing tools arrangement characterized by certain values of its working parameters; and (b) an optical measurement apparatus operable to apply a measurement to the structure and detect a diffraction signature indicative of light response of the structure to incident light, said diffraction signature varying with a change in at least one of said working parameters; and (c) an expert system trained to be responsive to input data representative of a diffraction signature to provide output data representative of corresponding effective value of said at least one working parameter, thereby enabling analysis of said effective value to determine deviation thereof from a corresponding nominal value and allow control of said process.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

More specifically, the present invention is used for controlling a photolithography process used in the manufacture of semiconductor devices, and is therefore described below with respect to this application. It should, however, be understood that the method of the present invention can be used for controlling any other process of the kind wherein variation of the process parameters affects the diffraction signature of a patterned structure being processed.

Figure 1:
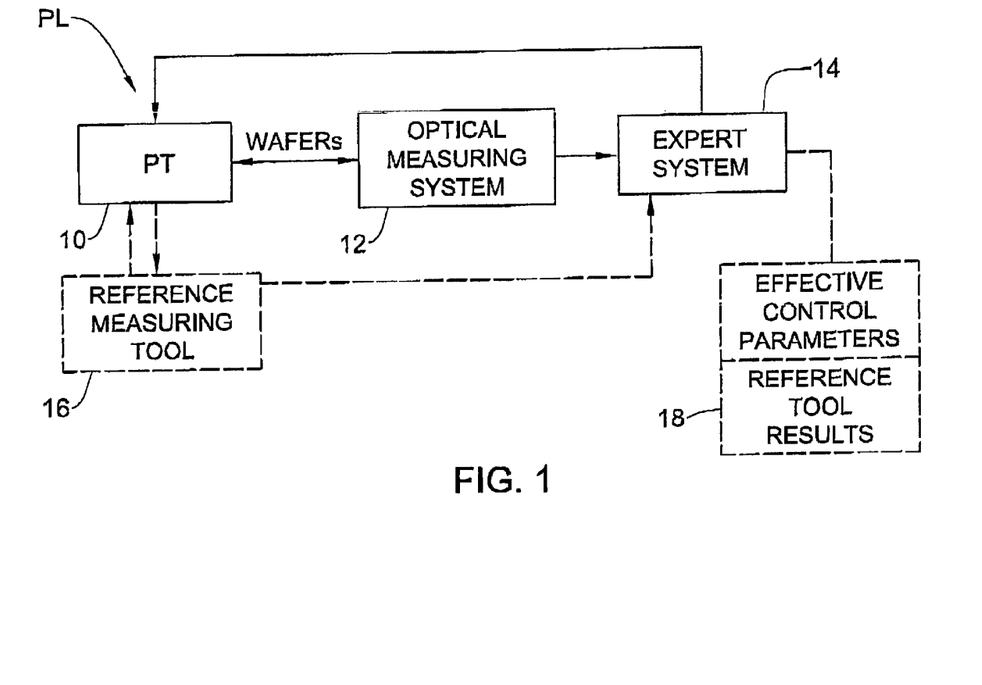
FIG. 1 is a schematic illustration of a part of production line in the manufacture of semiconductor devices utilizing the present invention.

Referring to FIG. 1, there is illustrated a part of production line PL utilizing the present invention. In the present example, the production line part PL is composed of a photolithography tools (PT) arrangement 10, a measuring apparatus 12 and a control unit 14. The construction of the photolithography tools arrangement does not form a part of the present invention, and therefore need not be specifically described, except to not its main constructional parts such as wafer loading-unloading, coating, exposure and developing tools, and a robot. The measuring apparatus is designed to be installable within the photolithography tools.

The measuring apparatus 12 presents an optical measuring system capable of measuring optical signatures (diffraction signatures) from sufficiently small areas of a wafer, and may utilize any known tool used in scatterometry measurements. The control unit 14 is a computer device installed with a programming utility, which is the so-called "expert system" (preferably, neural network) containing signal processing and computational intelligence for decision-making. Such a neural network (NN) utilizes a logic utility based on decision tables and a learning mode of operation for periodically updating the decision tables, in view of measurement and analysis results.

Optionally, a reference measurement tool 16 is used, which is an offline tool operable to apply measurements to the same sites measured by the measuring apparatus 12 or to other sites within the same fields and provide structure information from these sites. Such a reference tool may be a measurement unit of any known type using non-optical techniques, such as SEM or AFM, or optical techniques, such as a scatterometry tool.

The basic setup procedure carried out by the measurement system 12 will now be described.

The setup procedure of the measurement system 12 includes preparation of reference data, and the training of an expert system. The preparation of reference data includes the preparation of a parametric matrix and the measurements with the system 12, which consist of the following:

The parametric matrix is prepared by applying a set of production processes to the test wafers, to thereby process different wafers or different wafer fields using different working parameters. In the present example, the processing tool to be controlled is the exposure tool, and the varying working parameters are focus F and exposure (energy) E.

Figure 2:
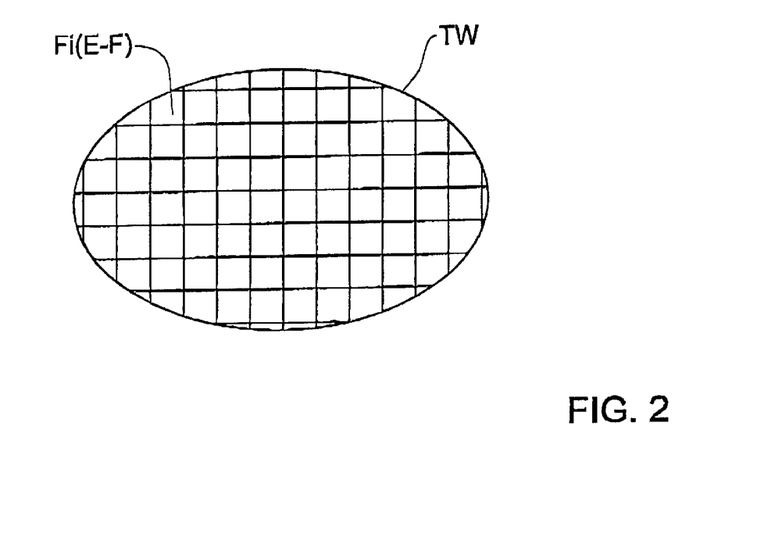
FIG. 2 schematically illustrates a FEM wafer prepared for the purposes of the present invention.

As shown in FIG. 2, the test wafer TW includes different fields, generally designated $F_i$, presenting the distribution of different focus-energy values, i.e., a focus-energy matrix (FEM). Preferably, this distribution is carried out in a randomly scattered manner on the wafer, and not along rows and columns as used in the conventional technique. This is associated with the fact that some non-homogeneity in wafer's parameters, such as underlying layer thickness, is position-dependent (e.g., depends on the wafer's radius). By randomly scattering the FEM fields, a situation can be achieved such that for each set of close thickness values, several fields of the FEM are obtained which represent different parts of the matrix. Otherwise (i.e., in the conventional technique), a correlation might occur between FEM parameters and thickness values which makes it more difficult for the expert system to generalize the measurements to different thickness values.

Since the present example provides a possibility to span the two control parameters on a single wafer, the use of a single test wafer may be sufficient for the initial training of the expert system (NN). Optionally, it is possible to expand the parametric wafer by producing additional test wafers, similar to the first one, having one or more of the "hidden parameters" (e.g., the photoresist film thickness) deliberately changed from wafer to wafer. The field distribution in the additional test wafer may be similar or different from the distribution on the first test wafer. The distribution of the additional sampled parameters should represent the naturally occurring distribution of these parameters, or at least should have a similar range. The additional parameters are not necessarily fully and orderly sampled in the matrix, but may be sparsely of even randomly sampled. Such a feature of the present invention, as the extension of the parametric matrix enables "immunization" of the NN to variations in these parameters that otherwise would have resulted with significant errors.

Figure 3A:
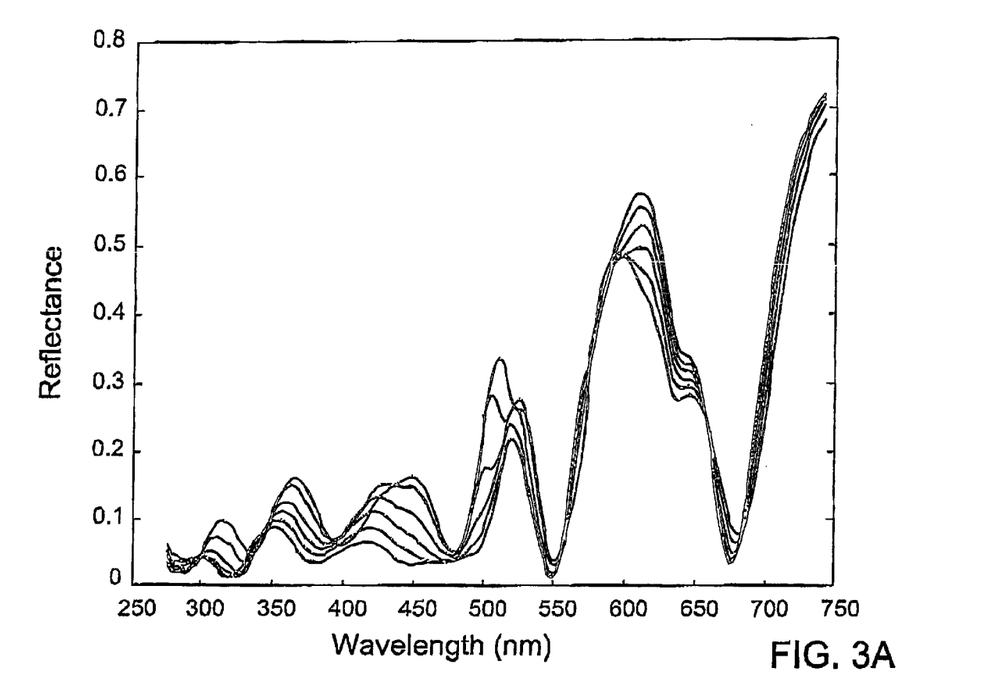
FIG. 3a illustrates different signatures corresponding to a process utilizing different exposure values and the same focus value.
Figure 3B:
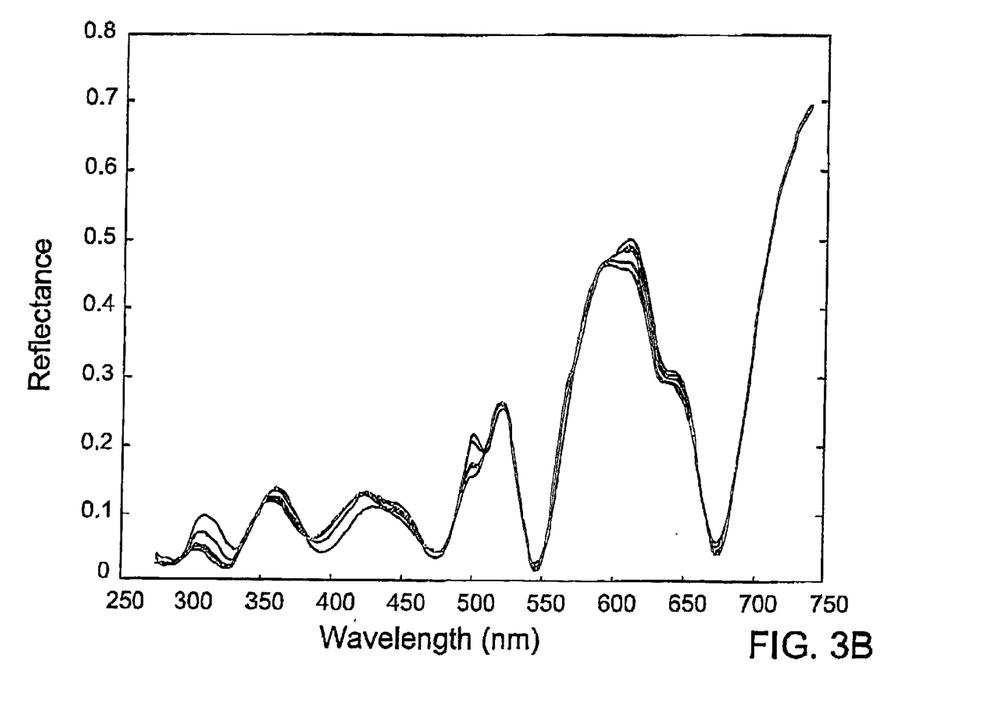
FIG. 3b illustrates different signatures corresponding to a process utilizing different focus values and the exposure value.

Once the parametric matrix is ready, all or part of the fields are measured by applying the measuring apparatus (12 in FIG. 1) to the test fields. The measured diffraction signatures are stored, along with the production conditions of the measured fields (i.e., parameters of the process). FIGS. 3a and 3b illustrate the spectrum variations for respectively, nominal focus value and variable exposure, and nominal exposure value and variable focus.

Optionally, the reference measurement tools (16 of FIG. 1) is applied to the same test fields, and measurement results are added to the reference data. For example, if CD-SEM is used as the reference tool, then all FEM fields for which optical (diffraction) signatures were measured are also measured by the CD-SEM, and CD values obtained with this tool are stored for each field, along with the process conditions of that field and the optical signatures measured in that field. The bulk of all measurements, both of the measurement apparatus (12) and of the reference tools (16) stored in correlation with each field's production parameters, is generally referred to as the "reference dad" or "signature library". It should be noted that the test wafer (fields) may be measured by the reference tool at the same state as measured by the measuring apparatus 12, or at another state, e.g., after additional processes have been applied to the wafers or before some process were applied thereto. For example, whereas the measuring apparatus 12 may be measuring the test fields after the photoresist development stage, the reference tool measurements may be taken after the subsequent etch and clean stages. Alternatively, the reference may be electrical measurements carried out on other structures in the same fields, at the end of the line. This possibility allows the system to correlate the signature measured in one (preparatory) stage with the outcome of a later stage, Using the reference tool allows for defining a process window, e.g., a range of allowed CD values. Correspondence between the control parameters (F-E) and the reference tool results (CD) results in a range of allowed control parameter sets (F-E), which could be used later on during production run Based on the reference tool data, the nominal values for the control parameters (F-E) can also be determined as a set of parameters resulting in the best structure (profile).

The expert system training consists of the following:

The expert system (preferably NN) receives a signature (in the extended sense, as defined above) as input data, and generates output including data indicative of the control parameters, which are those parameters of the parametric matrix that are used for the control of the process (F-E), and optionally also data indicative of the reference tool results (CD). The expert system is now trained using the reference data as a "training set" so as to be capable of providing correct output data (within certain allowed errors) upon receiving the signature of any field. This training is carried out using the same data, while changing the parameters of the NN, until an acceptable error is reached for all fields. Care has to be taken to avoid "over-doing" of the training process, since that will reduce the NN's ability to generalize (as described below).

During a production run, measurements and process control are performed in the following manner:

Production wafers are measured in one or more of the sites that were measured on the test wafers and measured data indicative of one or more diffraction signatures, respectively, is generated. The measured signature is input to the trained NN, which thereupon outputs the effective control parameters (F-E) corresponding to that signature, and optionally the corresponding effective reference tool results (CD).

It should be noted that, in this case, the results of the NN present "effective control parameter" and not "control parameters", as they may and may not be the real control parameters with which the field was actually produced.

The ability of the NN to provide reliable results to signatures that were not included in the training set presents the ability of NN to generalize. The generalization is expressed as the NN's ability to successfully interpolate and, to some extent, extrapolate between and beyond the cases that it was trained for.

Then, either a process alarm (PA) or a closed-loop process control (CLC) is performed based on the above results. In the case of the process alarm, the effective control parameters (F-E) are compared to the process window, given as a range of these parameters. If the effective control parameters are outside the process window, the PA is operated, e.g., by means of a message sent by communication to the production tool or the fab host computer, or by means of an audio-visual sign for the operator.

It should be understood that, in distinction to the method described in the above-indicated article of Benesch et al., according to which the NN is trained to directly provide a result indicative of that the measured signature (field) is within or out of the process window without giving any indication of the direction of the deviation, the method of the present invention provides for applying PA only after quantitative results for the process parameters have been obtained.

In the case of process control, the effective control parameters found by the NN for each measured field are compared to the nominal control parameter values. The direction and magnitude of the deviations from nominal values (optimal profile) can then be used for correcting the process parameters' values used in the production of subsequent wafers, such that the deviations are reduced in subsequent wafers (feedback). Alternatively, the same deviations may be used in following the production steps applied to the same wafer in order for the final result to be closer to the nominal one (feed-forward process control). The algorithm by which such feedback/feed-forward may be realized contains the following main features: a filtering mechanism reducing sporadic atypically large deviations and reducing the effect of random noise; a tendency to reduce constant errors to zero; and a mechanism by which the algorithm calibrates the effect of its own actions on the stability of the system.

It should be noted that the invented method as described above is capable of solving problems that may not necessarily originate from flutuations of the control parameters, but rather from changes of hidden parameters. If, for example, CDs are consistently too large due to some change in the post-exposure bake or in the development step, changing the exposure may bring the CDs back to their nominal values, compensating for the errors in other steps by deliberately changing the exposure control parameters. The recommended direction of such changes is immediately identified from the effective control parameters assigned to the measured signatures. If, for example, the effective exposure is consistently higher than the nominal one, it actually means that by reducing exposure below its current value (nominal or not), the CDs may be brought closer to nominal.

The present invention additionally provides for the validation of the expert system results and for the re-training of the expert system in time.

In order to validate the result of the NN, several methods may be used. One such validation method consists of searching through the signature library stored during the setup procedure for the library signature that best matches the newly measured signature. The matching quality is defined by a merit function. Interpolation between library signatures may than be applied in order to improve the final result. The control parameters of the best-matched signature may then be taken as an estimate for the signature's effective control parameters. The search results may either be used by themselves for the purpose of process control (i.e., as the final results), or facilitate validation of the reliability of the NN's result. In the latter case, the effective control parameters as determined by the NN, are compared to those determined by the search method, and, if the difference between the two results is below a predetermined threshold, the NN results are considered reliable. Alternatively, the field whose parameters are the closest ones to the NN's results may be found, and its corresponding signature, as stored in the signature library, may be compared with the newly measured signature using a merit function. If such a comparison yields a merit function lower than a predefined value, the result of the NN is considered valid and used for process control. Yet another alternative method for validation consists of utilizing additional, un-patterned sites. Such sites may be measured on the test wafers and stored as an additional part of the reference data. Once a newly measured signature is found to be outside the process window, an equivalent un-patterned site may be measured on the currently measured wafer. Upon comparing the signature of the newly measured un-patterned site with its counterpart stored in the reference data, the system can determine whether the observed deviation is likely to be due to the lithographical process or due to variations unaccounted for in previous production steps.

The retraining procedure consists of the following:

In many cases, F-E matrix wafers are routinely produced in order to calibrate processing tools and check the stability of the process. Adding additional wafers' data to the matrix serves such important purposes as increasing the amount of data available (thus reducing random errors), and extending the range of the matrix in parameters that are changing in time. Since some parameters change with time very slowly, the only way to sample them (i.e., find wafers having different values of these hidden parameters) is by sampling them over time. Once the NN is re-trained using the additional wafers, it will be immuned to these parameters as they change. Thus, the effect of re-training provides for continuously improving the NN immunization to the hidden parameter effect.

The following is an example (simulation) showing how the method of the present invention can be used in a simple case proving the capabilities of the method. The structures used in this simulation contain a trapezoid $SiO_2$ line profiles on top of two un-patterned layers ("underlayers") on a Si substrate. In order to simulate a F-E matrix, a 6×6 matrix was prepared with CD changing along one axis of the matrix (simulating changes in exposure), and wall-angle changing along the other axis of the matrix (simulating changes in focus). The film thickness of the underneath layers was treated as sampled parameters in the following manner. The range of each film thickness was defined as approx. ±10% from the respective nominal value. Each parameter was sampled 5 times within this range, thereby creating a 5×5 matrix. The full parametric matrix now included 5×5×6×6 fields, as for each combination of underlayer thickness the entire "F-E" matrix (CD-angle in the simulation) was created. The measurement tool used for the simulation was a broadband reflectometer measuring the reflectance of the sample as a function of wavelength. Spectra were calculated using a physical model to simulate the measured signatures for all the fields of the parametric matrix. Part or all of the signatures were then used for the training set (as described below), the required output parameters being a CD and wall angle (as simulators of Exposure and Focus). In order to test the ability of the NN, once trained, to generalize and give satisfactory results also to "new" signatures, a second "test set" of signatures was prepared. The test set included a similar matrix, which this time was computed for CD/angle values being half-way between the values of the training set. This test set thus represented the worst case in terms of the net's capability to interpolate. Once the NN had been trained, the test set was supplied to the NN as input data and the difference between the NN's results for the test set and the real values (with which the test set signatures had been calculated) were registered. Henceforward, the average of these differences over the whole test set was used as the measure for the NN's success to generalize and produce correct results.

Figure 4:
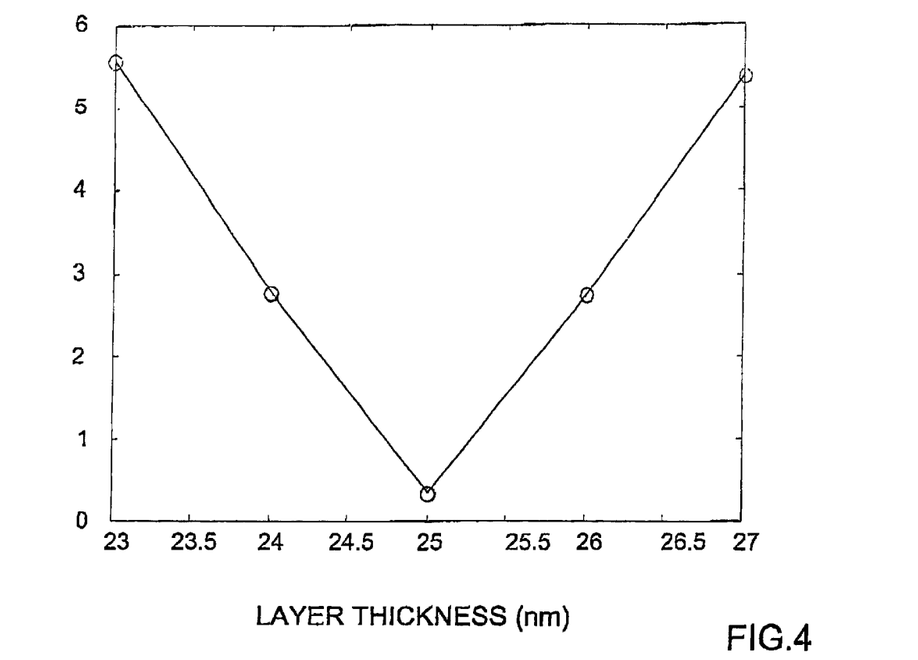
FIGS. 4 and 5 graphically illustrate simulation results of the method of the present invention.
Figure 5:
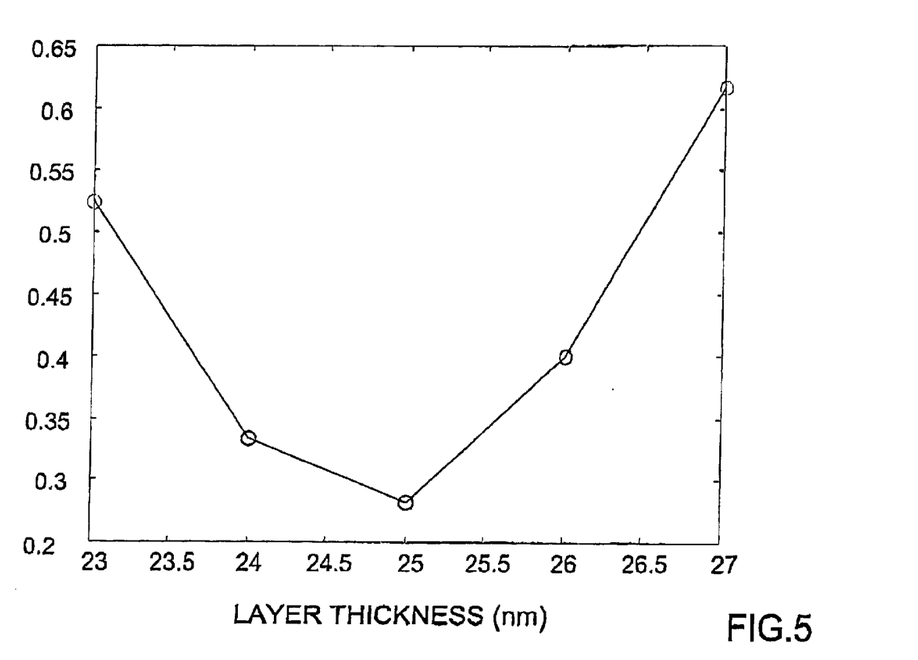

Two different cases were tested: with and without sampling of the underlayers. In the first case, only the nominal values of the underlayers were used in order to train the NN. Test sets with varying thickness values of one of the underlayers were then tested on the NN. The resulting mean error in the CD as a function of the underlayer thickness is shown in FIG. 4. As can be seen, the mean CD error for the nominal thickness value (25 nm in this example) is well below 1 nm. However, this error strongly increases with the change in the underlayer thickness (24 nm, 25 nm and 26 nm) were used for training the NN. As can be seen in FIG. 5, the net provided correct output values of CD (with errors well below 1 nm) not only for the 3 cases it had been trained for, but also for larger and smaller values of the underlayer thickness for which it had not been trained, showing very good extrapolation capabilities.

In another case, a set of 5 "FEM" wafers covering the center and the corners of the 5×5 thickness matrix were taken for the training set. In this case, the test set included all fields from the full 2D range of thickness values, and again, the results show the ability of the NN to generalize and create effective interpolation and extrapolation.

It should be noted that the above simulations did not include the use of reference tool data, which is optional for the purposes of the present invention.

Thus, the trained expert system is capable of analyzing a measured optical signature taken as a real-time measurement during a production run, so as to carry out at least one of the following: select corresponding control parameters (F-E) values from the existing signature library (search); determine whether the real-time measured data is within the control window or not (classification); and estimate effective control parameter (F-E) values corresponding to the real-time measured signature (interpolation/extrapolation). These analyses' results, each one or as a combined set, may thereafter be utilized for the control of the production process.

Figure 6A:
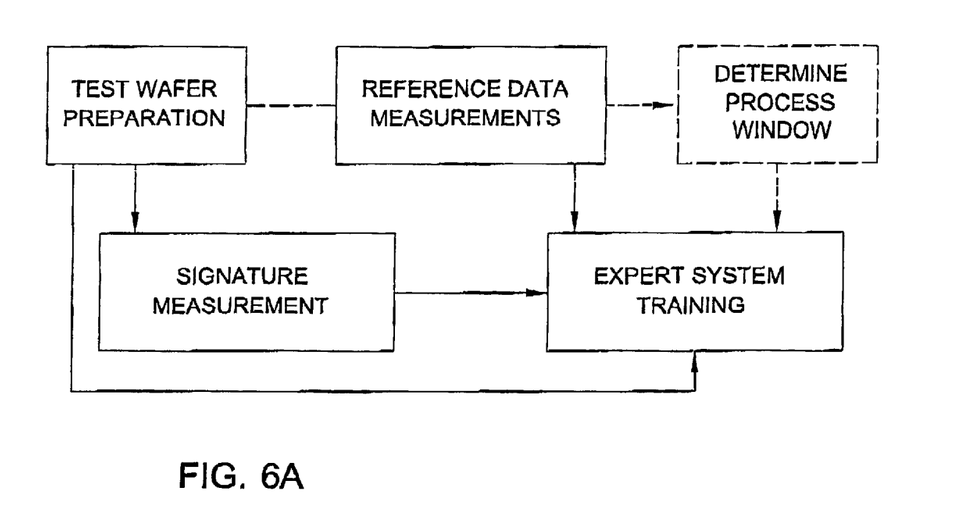
FIGS. 6a and 6b illustrate the main steps in the method according to the invention.
Figure 6B:
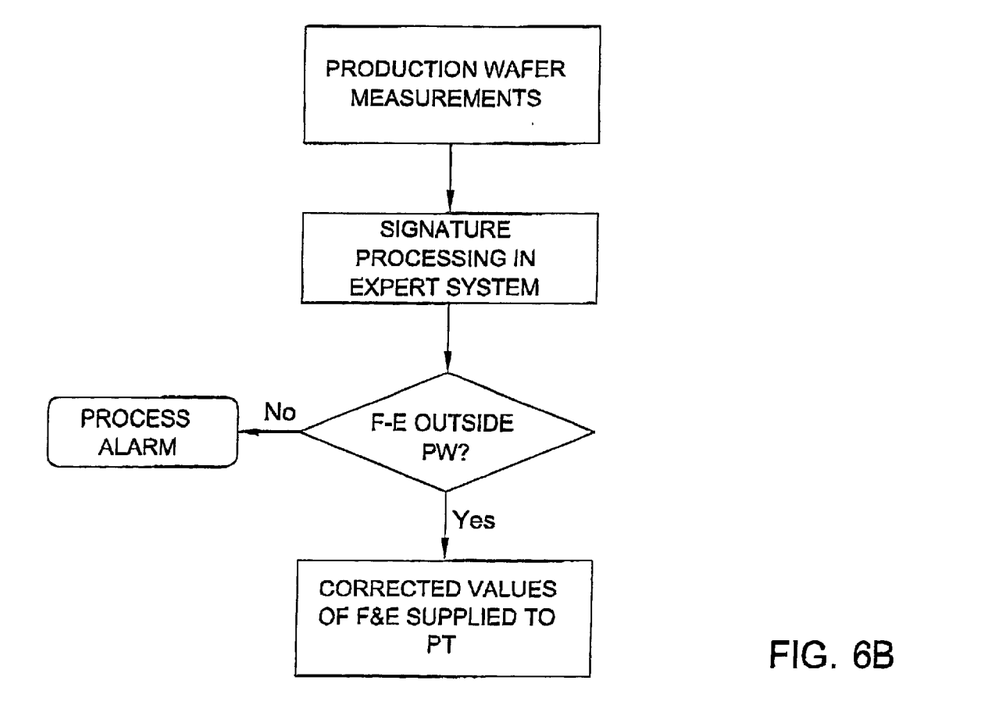

FIGS. 6a and 6b illustrate the flow diagram of the main operational steps in a method according to the present invention.

As shown in FIG. 6a, the following steps are carried out off-line, i.e., on the test wafer (FEM): (1) reference data is prepared by applying signature measurements to the previously developed test wafer TW (e.g., by the scatterometer 12), (2) process window PW is determined on the test wafer after being etched (e.g., by CD-SEM), and (3) the expert system is learned (trained).

As shown in FIG. 6b, during the on-line operational mode of the system, the signatures (measured data) are obtained on a real wafer and processed in the expert system to determine whether the measured data (F-E values) are within the process window or not. If the measured data are outside the process window, the corrected values of the working parameters are determined to be used for tuning the processing tool prior to applying it to further coming real wafers.

Immunity may be achieved by training the learning system not only using the measured signals from the FEM, but also from transformations thereof. Such transformations may be produced by modifying the measured signals according to predetermined rules, e.g., by applying different gain and offset factors, or by adding random noise. Alternatively, the transformations can be used only as a validation step that determines at what stage the training process should stop, in order to avoid over-fitting.

The same may be achieved by selectively choosing those parts of the signature, e.g., specific spectral ranges, which present higher sensitivity to the F-E parameters, as compared to other parts of the signature. To this end, the variability (e.g., standard deviation) for each part of the spectrum (e.g., each spectral point) over the entire F-E matrix can be calculated. Those parts that are not sensitive or are relatively less sensitive will be disregarded, in order to minimize the effect of other parameters on the NN results. This technique may be further refined using the variability function vs. the signature's free parameter (e.g., wavelength) as a character according to which the NN's sensitivity is tuned. Such tuning may be performed by adding to the training set duplicates of real measurements that have to be somewhat distorted by adding a random noise, such that those parts of the signature that are more sensitive to the F-E parameters are least distorted and those that are less sensitive to F-E are most distorted. Using these additional signatures to train the NN, the net's sensitivity to those parts of the spectrum that have been distorted is reduced, achieving the same result.

The NN can be trained using data that comes from several different FEMs (wafers). Assuming that the number and choice of wafers is sufficiently large to represent the variability of other parameters, such as layer thickness, the NN can generalize the result from the given examples and reduce dramatically the effect of variations in these parameters on F-E results. Indeed, when using several wafers, it is possible to achieve good training even without using the entire FEM on each wafer. Thus, if sufficient (random) variability of the perturbing parameters exists on the same wafer, it is possible to get the same immunity to variations in these parameters using a single wafer.

As can be seen from the example described above with reference to FIGS. 4 and 5, the errors are minimal for the center value of the layer thickness that corresponds to the training set (e.g., 25 nm-wafer). However, errors increase dramatically once the layer thickness changes in either direction from that of the training set. Using the training set including three "wafers"—24 nm, 25 nm and 26 nm, the error is reduced dramatically not only for the training values, but also for other values of layer thickness which lie outside the training set. Hence, it is evident that the net generalizes the information allowing extrapolation (as well as interpolation, which is easier) to other layer thickness values.

As indicated above, immunity may also be gained by distributing the FEM fields in a "randomly scattered" manner on the wafer. Generally speaking, the immunity can be optimized by utilizing various "hidden parameters" in the learning mode of the NN, such as layers thicknesses, gain, offset, etc.

Those skilled in the art will readily appreciate that various modifications and changes can be applied to the preferred embodiments of the invention as hereinbefore exemplified without departing from its scope defined in and by the appended claims.

What is claimed is:

1. A method of controlling a process to be applied to a patterned structure in a production run, the method comprising the steps of:
   (i) providing reference data including data representative of diffraction signatures corresponding to a group of different fields in a structure similar to said patterned structure in a production line and data representative of a control window for the process parameters corresponding to a signature representative of desired process results, said group of different fields being characterized by different process parameters used in the manufacture of these fields;
   (ii) providing an expert system in the form of an artificial neural network trained to be responsive to input data representative of a diffraction signature to provide output data representative of corresponding effective parameters of the process;
   (iii) applying optical measurements to at least one site on said patterned structure in the production line to obtain at least one diffraction signature of said patterned structure in the production line and generate data representative thereof;
   (iv) supplying the generated data to said expert system, which analyses the said data to thereby directly determine effective parameters of the process applied to said patterned structure in the production line;
   (v) analyzing said effective process parameters to determine deviation thereof from corresponding nominal values to thereby enable process control; and
   (vi) verifying said effective process parameters resulting from the neural network analysis by searching in a signature library that includes results of a plurality of measurements applied to the structure and indicative of process parameters corresponding to various signatures, to thereby ensure a high reliability score of the neural network, wherein said searching is aimed at finding the diffraction signature, which corresponding process parameters within said control window are the closest ones to those of the neural network results; said verifying comprising comparing the found reference signature with the signature measured in the patterned structure in the production line to determine whether a merit function between said found signature and said measured signature is sufficiently low, being thereby indicative of the high reliability score of the neural network results.

2. The method according to claim 1, wherein said providing of the reference data comprises the steps of preparing a parametric matrix including variations of at least one process parameter within a group of different test fields and applying measurements to said different test fields to determine corresponding signatures.

3. The method according to claim 2, wherein the preparation of the parametric matrix comprises the step of applying the process to be controlled to the different test fields utilizing different values of one or more process parameters.

4. The method according to claim 3, wherein said different values of one or more 5 process parameters are randomly distributed in said different test fields.

5. The method according to claim 3, wherein said different fields are also characterized by different thickness values of underlying layers in the patterned structure.

6. The method according to claim 3, wherein the process is applied to the different fields in the same test structure.

7. The method according to claim 3, wherein the process is applied to the different fields in different test structures.

8. The method according to claim 4, wherein the process is applied to the different fields in different test structures.

9. The method according to claim 1, wherein the process to be controlled is a lithography process, the process parameters including at least one of exposure energy and focus of incident light.

10. The method according to claim 1, wherein said training of the expert system is carried out utilizing the reference data as training set.

11. The method according to claim 1, and also comprising the step of retraining the neural network with time by repeating steps (i) and (ii) utilizing additional test fields.

12. The method according to claim 1, wherein said analyzing to determine the effective process parameters comprises fitting of said generated data and the reference data.

13. The method according to claim 1, and also comprising the step of applying a reference tool to said test fields to thereby take additional measurements and generate data representative of reference tool results indicative of a control window corresponding to the desired process results to be included in the reference data.

14. The method according to claim 1, wherein said signature library is included in said reference data.

15. The method according to claim 1, wherein the neural network results are compared to the search results to ensure that the neural network results are sufficiently close to said control window.

16. The method according to claim 1, wherein the patterned structure under processing is a semi-conductor wafer.

17. The method according to claim 1, for controlling a lithography process applied to the structures progressing on a production line.

* * * * *